United States Patent
Guo

(10) Patent No.: US 9,287,323 B2
(45) Date of Patent: Mar. 15, 2016

(54) PERPENDICULAR MAGNETORESISTIVE ELEMENTS

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/149,757

(22) Filed: Jan. 7, 2014

(65) Prior Publication Data

US 2014/0217526 A1  Aug. 7, 2014

Related U.S. Application Data

(60) Provisional application No. 61/750,057, filed on Jan. 8, 2013.

(51) Int. Cl.
| | | |
|---|---|---|
| *H01L 27/22* | (2006.01) | |
| *G11C 11/02* | (2006.01) | |
| *G11C 11/16* | (2006.01) | |
| *H01L 43/08* | (2006.01) | |
| *H01L 43/10* | (2006.01) | |

(52) U.S. Cl.
CPC ............... *H01L 27/224* (2013.01); *G11C 11/02* (2013.01); *G11C 11/161* (2013.01); *H01L 27/22* (2013.01); *H01L 27/222* (2013.01); *H01L 43/08* (2013.01); *H01L 43/10* (2013.01)

(58) Field of Classification Search
CPC ..... H01L 27/22; H01L 27/222; H01L 27/224; G11C 11/00; G11C 11/02; G11C 11/06014; G11C 11/16; G11C 11/161
See application file for complete search history.

(56) References Cited

U.S. PATENT DOCUMENTS

| | | | | |
|---|---|---|---|---|
| 5,514,484 | A * | 5/1996 | Nashimoto | ........... C04B 35/462 117/948 |
| 8,866,367 | B2* | 10/2014 | Fox | ......................... C30B 23/02 310/357 |
| 2004/0075388 | A1* | 4/2004 | Miyashita | ................. H01J 9/02 313/586 |
| 2008/0088980 | A1* | 4/2008 | Kitagawa | ............... B82Y 25/00 360/313 |
| 2008/0253174 | A1* | 10/2008 | Yoshikawa | ............. G11C 11/16 365/158 |
| 2009/0080238 | A1* | 3/2009 | Yoshikawa | ............. G11C 11/16 365/158 |
| 2013/0069182 | A1* | 3/2013 | Ohsawa | ................... H01L 29/82 257/421 |
| 2013/0088125 | A1* | 4/2013 | Shih | ........................ H02K 5/225 310/68 A |
| 2014/0119109 | A1* | 5/2014 | Nagase | ................... H01L 43/08 365/158 |

* cited by examiner

*Primary Examiner* — Eduardo A Rodela
(74) *Attorney, Agent, or Firm* — 5Suns; Yuanhui Huang

(57) ABSTRACT

A perpendicular magnetoresistive element comprises anovel buffer layer provided on a surface of the recording layer, which is opposite to a surface of the recording layer where the tunnel barrier layer is provided, wherein at least the portion of the buffer layer interfacing to the recording layer contains a rocksalt crystal structure having the (100) plane parallel to the substrate plane and at least a portion of the buffer layer comprises a doped element having conductivity enhancement and the perpendicular resistance of the buffer layer is relatively small than that of the tunnel barrier layer. The invention preferably includes materials, configurations and processes of perpendicular magnetoresistive elements suitable for perpendicular spin-transfer torque MRAM applications.

21 Claims, 2 Drawing Sheets

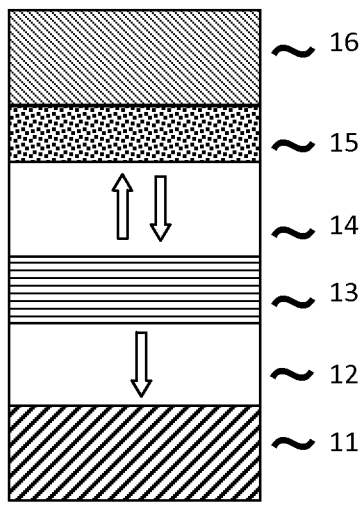
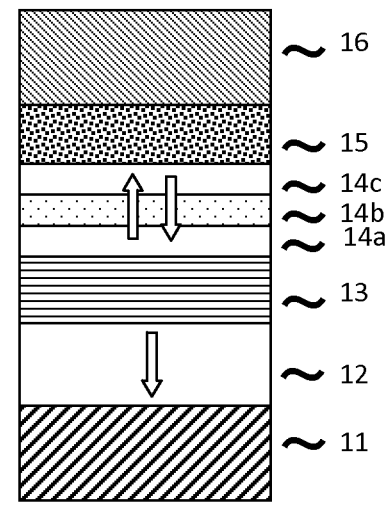
Figure 1.
Figure 2.
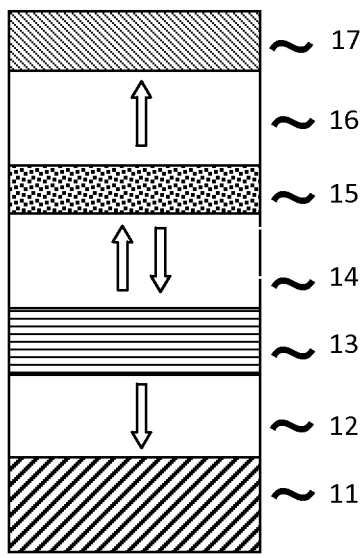
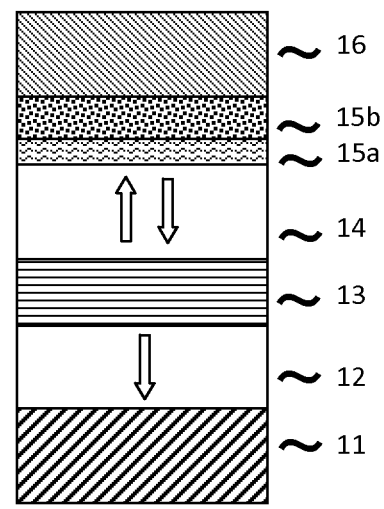
Figure 3.
Figure 4.

PERPENDICULAR MAGNETORESISTIVE ELEMENTS

RELATED APPLICATIONS

This application claims the priority benefit of U.S. Provisional Application No. 61/750,057, filed Jan. 8, 2013, which is incorporated herein by reference.

BACKGROUND OF THE INVENTION

1. Field of the Invention

This invention relates to the field of perpendicular magnetoresistive elements. More specifically, the invention comprises perpendicular spin-transfer-torque magnetic-random-access memory (MRAM) using perpendicular magnetoresistive elements as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of magnetic tunnel junctions (also called MTJs) have been drawing increasing attention as the next-generation solid-state nonvolatile memories that can cope with high-speed reading and writing, large capacities, and low-power-consumption operations. A magnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong perpendicular magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the damping constant and inversely proportional to a spin polarization, and increases in proportional to a square of an area size. Therefore, reduction of the damping constant, increase of the spin polarization, maintain of the perpendicular anisotropy and reduction of an area size are mandatory technologies to reduce the write current.

BRIEF SUMMARY OF THE PRESENT INVENTION

The present invention comprises perpendicular magnetoresistive element for perpendicular spin-transfer-torque MRAM. The perpendicular magnetoresistive element in the invention are sandwiched between an upper electrode and a lower electrode of each MRAM memory cell, which further comprises a write circuit which bi-directionally supplies a spin polarized current to the magnetoresistive element and a select transistor electrically connected between the magnetoresistive element and the write circuit.

The invention includes a magnetoresistive element comprising: a recording layer having magnetic anisotropy in a direction perpendicular to a film surface and having a variable magnetization direction; a reference layer having magnetic anisotropy in a direction perpendicular to a film surface and having an invariable magnetization direction; a tunnel barrier layer provided between the recording layer and the reference layer; and a buffer layer provided on a surface of the recording layer, which is opposite to a surface of the recording layer where the tunnel barrier layer is provided, wherein at least the portion of the buffer layer interfacing to the recording layer contains a rocksalt crystal structure having the (100) plane parallel to the substrate plane, at least a portion of the buffer layer comprises a doped element enabling electrical conductivity enhancement and the perpendicular resistance of the buffer layer is relatively smaller than that of the tunnel barrier layer; and a base layer provided on a surface of the buffer layer, which is opposite to a surface of the buffer layer where the recording layer is provided.

As an amorphous ferromagnetic material, like CoFeB, in the recording layer is thermally annealed, a crystallization process occurs to form bcc CoFe grains having epitaxial growth with (100) plane parallel to surface of the rocksalt crystal buffer layers with in-plane expansion and out-of-plane contraction. Accordingly, a perpendicular anisotropy, as well as a perpendicular magnetization, is induced in the recording layer. The invention preferably includes materials, configurations and processes of perpendicular magnetoresistive elements.

BRIEF DESCRIPTION OF THE DRAWINGS

FIG. 1 is a cross-sectional view showing a configuration of an MTJ element 10 according to the first embodiment;

FIG. 2 is a cross-sectional view showing a configuration of an MTJ element 10 according to a first modification of the first embodiment;

FIG. 3 is a cross-sectional view showing a configuration of an MTJ element 10 according to a second modification of the first embodiment;

FIG. 4 is a cross-sectional view showing a configuration of an MTJ element 10 according to the second embodiment;

DETAILED DESCRIPTION OF THE INVENTION

Figure 5:
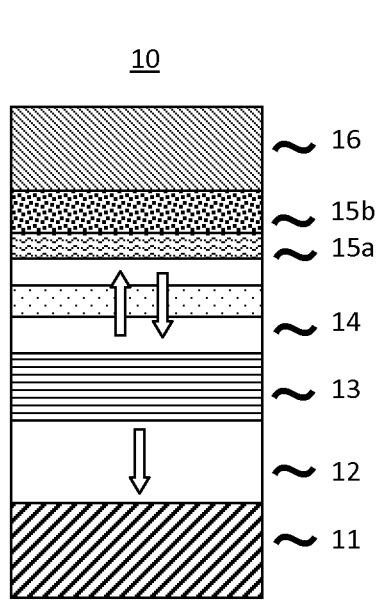
FIG. 5 is a cross-sectional view showing a configuration of an MTJ element 10 according to a first modification of the second embodiment.

In general, according to one embodiment, there is provided a magnetoresistive element comprising:
a recording layer having magnetic anisotropy in a direction perpendicular to a film surface and having a variable magnetization direction;
a reference layer having magnetic anisotropy in a direction perpendicular to a film surface and having an invariable magnetization direction;
a tunnel barrier layer provided between the recording layer and the reference layer;
a buffer layer provided on a surface of the recording layer, which is opposite to a surface of the recording layer where the tunnel barrier layer is provided, wherein at least the portion of the buffer layer interfacing to the recording layer contains a rocksalt crystal structure having the (100) plane parallel to the substrate plane, at least a portion of the buffer layer comprises a doped element enabling electrical conductivity enhancement and the perpendicular resistance of the buffer layer is relatively smaller than that of the tunnel barrier layer;
and a base layer provided on a surface of the buffer layer, which is opposite to a surface of the buffer layer where the recording layer is provided.

First Embodiment

FIG. 1 is a cross-sectional view showing a configuration of an MTJ element 10 as a MTJ element according to the first embodiment. The MTJ element 10 is configured by stacking a seed layer as a bottom electrode 11, a reference layer 12, a tunnel barrier layer 13, a recording layer 14, a buffer layer 15, and a base layer 16 in this order from the bottom.

The recording layer 14 and reference layer 12 each are made of a ferromagnetic material, and have uni-axial magnetic anisotropy in a direction perpendicular to a film surfaces. Further, directions of easy magnetization of the recording layer 14 and reference layer 12 are also perpendicular to the film surfaces. In another word, the MTJ element 10 is a perpendicular MTJ element in which magnetization directions of the recording layer 14 and reference layer 12 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The recording layer 14 has a variable (reversible) magnetization direction. The reference layer 12 has an invariable (fixed) magnetization direction. The reference layer 12 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 14 while the magnetization direction of the reference layer 12 remains unchanged. An MTJ element 10 which comprises a recording layer 14 having a variable magnetization direction and a reference layer 12 having an invariable magnetization direction for a predetermined write current can be achieved.

The tunnel barrier layer 13 is made of a metal oxide or a metal nitride, such as MgO, MgZnO, MgN, etc.

An example configuration of the MTJ element 10 will be described below. The reference layer 12 is made of CoFeB (2 nm)/TbCoFe (10 nm). The tunnel barrier layer 13 is made of MgO (1 nm). The recording layer 14 is made of CoFeB (1.2 nm). The buffer layer 15 is made of MgCrO (1.4 nm) where the doped Cr has a composition of 3%. The base layer 16 is made of Ta (20 nm)/Cu (20 nm)/Ta (20 nm)/CoFeB (0.5 nm). Each element written in the left side of "/" is stacked above an element written in the right side thereof.

The buffer layer 15 mainly serves to enhance perpendicular magnetic anisotropy of the recording layer. Since the damping constant of the recording layer may increase (deteriorate) depending on its contacting material, which is known as a spin pumping effect, the buffer layer also needs to prevent increase of the damping constant of the recording layer by reducing the spin pumping.

Since a metal oxide (or nitride, chloride) layer, such as MgO, has a rocksalt crystalline structure having the (100) plane parallel to the substrate plane as its naturally stable structure having the (100) plane parallel to the substrate plane, especially as it interfaces with amorphous CoFeB recording layer. Thus, a pure MgO layer is a good candidate as the buffer layer 15 for providing or enhancing a perpendicular anisotropy of the recording layer. Besides, MgO is also a stable interface layer which reduces spin pumping effect. The CoFeB layer comprised in the recording layer 14 is formed into an amorphous state or nano-crystal state as deposited. The MgO layer comprised in the buffer layer 15 is formed into rocksalt crystal grains with the (100) plane parallel to the substrate plane. In the rocksalt crystal structure, two fcc sublattices for Mg and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal buffer layers with in-plane expansion and out-of-plane contraction. As the MgO layer is thick enough (more than 1.2 nm), a strong perpendicular anisotropy is introduced in the CoFeB recording layer. Accordingly, a perpendicular magnetization is induced in the CoFeB recording layer.

However, due to a high resistance in a thick pure MgO layer, a read output is caused to decrease when a read current flows across MgO buffer layer. A resistance of a buffer layer can be reduced and decrease of the read output can accordingly be reduced by using a MgCrO buffer layer having a doped Cr element having a composition of 3% to replace a pure MgO buffer layer. The MgCrO buffer layer 15 is formed by depositing a film of Mg—Cr with a subsequent exposure to an oxygen atmosphere (natural oxidation). Alternatively, the MgCrO buffer layer can be formed using a mixed gas containing natural oxygen ($O_2$), or radical, or ionized oxygen and Argon (Ar) after co-sputtering Mg and Cr metal layer, or sputtering MgCr alloy. Other methods include, but not limited to, sputtering a composite MgCrO target in an Argon (Ar) gas, or a mixed gas containing Argon (Ar) and nitrogen ($N_2$). In such MgCrO composition, since the majority of Cr impurity adopts Mg substitutional sites, up to 5% Cr can be embedded into MgO films without deteriorating the rocksalt crystal structure.

A buffer layer may comprise other elements as the impurity doping agent. Dopant can be also selected from Al, B, Si, P, S, Cu, Be, Ca, Li, Na, Sc, Ti, Rb, V, Mn. The result of the doping with limited dopant composition would lead to a reduced resistance at even thicker film still having a rocksalt crystal structure. For example, doping with a few percent of Li could lead to formation of semiconducting holes and accordingly reduce the resistance by several orders in an insulating pure MgO film.

FIG. 2 is a cross-sectional view showing a configuration of an MTJ element 10 as a MTJ element according to a first modification of the first embodiment. The MTJ element 10 has a recording layer 14 has a multi-layer structure in which a first ferromagnetic layer 14a, a nonmagnetic insertion layer 14b, and a second ferromagnetic layer 14c, and rest layers are the same as shown in FIG. 1. An example configuration will be described below. The first ferromagnetic layer 14a is CoFeB (0.8 nm), the insertion layer 14b is Ta (0.3 nm), and the second magnetic layer 14c is CoFeB (0.6). From layer 14c to layer 14a, the Fe composition relative to Co is increased to improve MR ratio. Further, the perpendicular magnetic anisotropy can be improved by a thermal annealing process in which Boron atoms move toward the insertion Ta layer.

FIG. 3 is a cross-sectional view showing a configuration of an MTJ element 10 as a MTJ element according to a second modification of the first embodiment. The MTJ element 10 is configured by stacking a seed layer as a bottom electrode 11, a reference layer 12, a tunnel barrier layer 13, a recording layer 14, a buffer layer 15, a compensating layer 16, and a base layer 17; in this order from the bottom. The compensating layer 16 has a bi-layer structure TbCoFe (20 nm)/CoFeB (2 nm). The reference layer 12 is a multi-layer CoFeB (1 nm)/(Co/Pd)n. Each element written in the left side of "/" is stacked above an element written in the right side thereof. (Co/Pd)n is a super lattice structure which enables a strong perpendicular anisotropy. Both the compensating layer and reference layer have perpendicular magnetizations, however a careful selection of these layer structures can be made to make them have different perpendicular anisotropy or coercive forces so that their magnetizations can be set towards opposite directions by applying external perpendicular magnetic fields. A careful selection of magnetic compensating layer and reference layer with opposite perpendicular magnetizations would lead near-zero or zero perpendicular stray field acting on the recording layer, accordingly, the thermal stability is improved.

Second Embodiment

FIG. 4 is a cross-sectional view showing an example configuration of the MTJ element 10 according to the second embodiment. The MTJ element 10 is configured by stacking a seed layer as a bottom electrode 11, a reference layer 12, a tunnel barrier layer 13, a recording layer 14, a first buffer layer 15a, a second buffer layer 15b, and a base layer 16 in this order from the bottom.

A single buffer layer, as shown in FIG. 1, is made of MgXO where X is a doping element selected from Cr, Al, B, Si, etc. As the thermal annealing with a temperature higher than 250-degree is conducted for the crystallization of CoFeB recording layer, some dopants may have a strong tendency to accumulate in a near surface region, the original rocksalt crystal structure of MgO may deteriorate in the interface region close to the recording layer, accordingly the perpendicular anisotropy strength may be degraded.

In this embodiment, the buffer layer 15 has a bi-layer structure in which a first buffer layer 15a, and a second buffer layer 15b are stacked in this order from the bottom. The first buffer layer 15a is made of a thin pure MgO layer, and the second buffer layer 15b is made of a doped MgXO layer where X is a doping agent. Naturally, a first buffer layer MgO can readily form stable rocksalt crystal grains with a cubic lattice plane (100) in a substrate plane. Although a stand alone MgXO layer may form rocksalt crystal structure or different crystal structure, depending upon the selection of the doping element and its composition, a second buffer MgXO layer can readily form rocksalt crystal grains having epitaxial growth on top of a seed MgO layer having a rocksalt crystal. A strong perpendicular anisotropy is expected in the recording layer. Similarly, a resistance of the bi-layer buffer structure MgXO/MgO is reduced and decrease of the read output can accordingly be reduced by using a thin MgO film as a first buffer layer which is made by a subsequent exposure to an oxygen atmosphere (natural oxidation), or radical, or ionized oxygen and Argon (Ar) after Mg deposition, and adding a doped MgXO film as a second buffer layer. A second buffer layer MgXO can be formed by depositing a film of MgX with bias on top of the first buffer layer. A subsequent exposure to an oxygen atmosphere (natural oxidation) is optional. Alternatively, the MgXO buffer layer may be formed using a mixed gas containing natural oxygen ($O_2$), or radical, or ionized oxygen and Argon (Ar) after co-sputtering Mg and X metal layer, or sputtering MgX alloy. Other methods include, but not limited to, sputtering a composite MgXO target in an Argon (Ar) gas, or a mixed gas containing Argon (Ar) and nitrogen ($N_2$). Since the first buffer layer of such a bi-layer buffer layer structure is made of a pure MgO, it can prevent dopant accumulation in the interface region close to the recording layer, accordingly the perpendicular anisotropy doesn't deteriorate from the thermal annealing of a magnetoresistive element.

FIG. 5 is a cross-sectional view showing an example configuration of the MTJ element 10 according to a first modification of the second embodiment. The MTJ element 10 has a recording layer 14 has a multi-layer structure in which a first ferromagnetic layer 14a, a nonmagnetic insertion layer 14b, and a second ferromagnetic layer 14c, and rest layers are the same as shown in FIG. 4. An example configuration will be described below. The first ferromagnetic layer 14a is CoFeB (0.8 nm), the insertion layer 14b is Ta (0.3 nm), and the second magnetic layer 14c is CoFeB (0.6). From layer 14c to layer 14a, the Fe composition relative to Co is increased to improve MR ratio. Further, the perpendicular magnetic anisotropy can be improved by a thermal annealing process in which Boron atoms move toward the insertion Ta layer.

Figure 6:
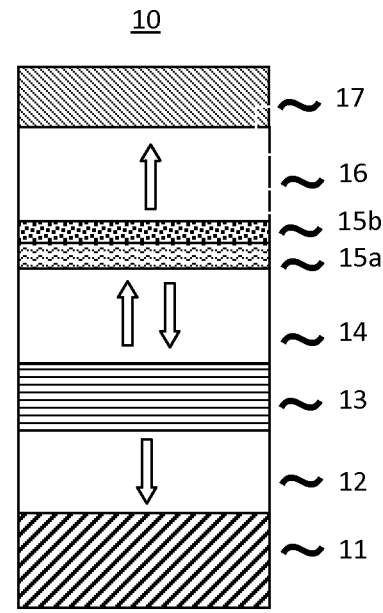
FIG. 6 is a cross-sectional view showing a configuration of an MTJ element 10 according to a second modification of the second embodiment.

FIG. 6 is a cross-sectional view showing a configuration of an MTJ element 10 as a MTJ element according to a second modification of the second embodiment. The MTJ element 10 is configured by stacking a seed layer as a bottom electrode 11, a reference layer 12, a tunnel barrier layer 13, a recording layer 14, a first buffer layer 15a, a second buffer layer 15b, a compensating layer 16, and a base layer 17; in this order from the bottom. The compensating layer 16 has a bi-layer structure TbCoFe (20 nm)/CoFeB (2 nm). The reference layer 12 is a multi-layer CoFeB (1 nm)/(Co/Pd)n. Each element written in the left side of "/" is stacked above an element written in the right side thereof. (Co/Pd)n is a super lattice structure which enables a strong perpendicular anisotropy. Both the compensating layer and reference layer have perpendicular magnetizations, however a careful selection of these layer structures can be made to make them have different perpendicular anisotropy or coercive forces so that their magnetizations can be set towards opposite directions by applying external perpendicular magnetic fields. A careful selection of magnetic compensating layer and reference layer with opposite perpendicular magnetizations would lead near-zero or zero perpendicular stray field acting on the recording layer, accordingly, the thermal stability is improved.

Third Embodiment

Figure 7:
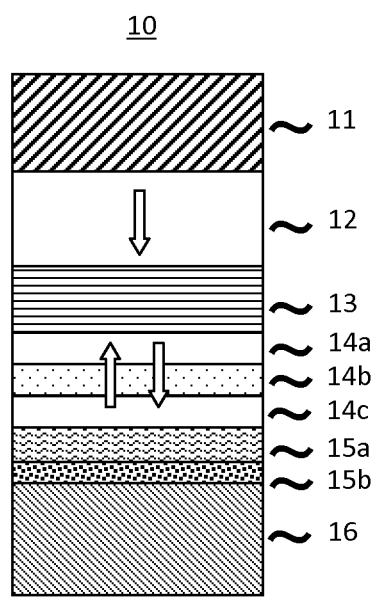
FIG. 7 is a cross-sectional view showing a configuration of an MTJ element 10 according to the third embodiment.

FIG. 7 is a cross-sectional view showing an example configuration of the MTJ element 10 according to the third embodiment. This is a reversed structure of the first modification of the second embodiment as shown in FIG. 5.

Figure 8:
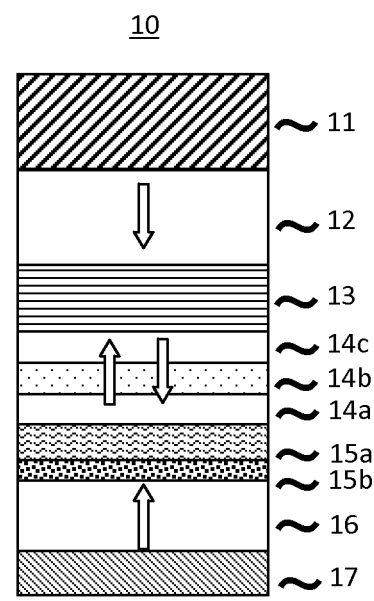
FIG. 8 is a cross-sectional view showing a configuration of an MTJ element 10 according to a first modification of the third embodiment.

FIG. 8 is a cross-sectional view showing an example configuration of the MTJ element 10 according to a first modification of the third embodiment. This is a reversed structure of the second modification of the second embodiment as shown in FIG. 6, except that the recording layer 14 has a multi-layer structure in which a first ferromagnetic layer 14a, a nonmagnetic insertion layer 14b, and a second ferromagnetic layer 14c.

While certain embodiments have been described above, these embodiments have been presented by way of example only, and are not intended to limit the scope of the inventions. For an example, the perpendicular MTJ element in each embodiment may have reversed layer-by-layer sequence. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a recording layer having magnetic anisotropy in a direction perpendicular to a film surface and having a variable magnetization direction;
a reference layer having magnetic anisotropy in a direction perpendicular to a film surface and having a first invariable magnetization direction;
a tunnel barrier layer provided between the recording layer and the reference layer;
a buffer layer provided on a surface of the recording layer, which is opposite to a surface of the recording layer where the tunnel barrier layer is provided, wherein at least the portion of the buffer layer interfacing to the recording layer contains a rocksalt crystal structure having the (100) plane parallel to the substrate plane and at least a portion of the buffer layer comprises a doped element having electrical conductivity enhancement and the perpendicular resistance of the buffer layer is relatively smaller than that of the tunnel barrier layer; and
a base layer provided on a surface of the buffer layer, which is opposite to a surface of the buffer layer where the recording layer is provided.

2. The element of claim 1, wherein said buffer layer is a single layer of metal oxide, or nitride, or chloride having rocksalt crystal structure comprising at least one metal element selected from Na, Li, Mg, Ca, Zn, Cd, and comprising as least one doping element preferred to be selected from Cr, Al, B, Si, P, S, Cu, Zn, Cd, In, Sn, Ag, Be, Ca, Li, Na, Sc, Ti, Rb, V, Mn, but not limited to these elements.

3. The element of claim 1, wherein said doping element of said buffer layer is preferred to have a composition equal to or less than 5%.

4. The element of claim 1, wherein said base layer is non-magnetic metal layer, preferred to be selected from Ta, Ti, W, Nb, Mo, V, Ru, Cu, Al, Zr.

5. The element of claim 1, wherein said base layer is non-magnetic nitride layer, preferred to be selected from AlN, NbN, ZrN, IrN, TaN, TiN, and SiN.

6. The element of claim 1, wherein said base layer is amorphous alloy, preferred to be selected from CoFeB, CoB, FeB, CoNiFeB, CoNiB, NiFeB, NiB, wherein B composition is more than 20%.

7. The element of claim 1, wherein said tunnel barrier layer is made of non-magnetic metal oxide or nitride layer, preferred to be MgO, ZnO, MgZnO.

8. The element of claim 1, wherein the recording layer is Co-alloy, preferred to be CoFeB or CoB, the B composition percentage is preferred to be in a range of 5-25%.

9. The element of claim 1, wherein the recording layer is a multi-layer comprising a first Co-alloy layer immediately adjacent to said spacing layer, preferred to be CoFe, or CoFeB, or their multilayer CoFe/CoFeB or CoFeB/CoFe, a second Co-alloy layer, preferred to be CoFeB or CoB, an insertion layer provided between the first Co-alloy layer and the second Co-alloy layer and containing at least one element selected from Ta, Hf, Zr, Ti, Mg, Nb, W, Mo, Ru, Al, Cu, Si and having a thickness less than 0.5 nm.

10. The element of claim 1, wherein said buffer layer is a bi-layer comprising a first buffer layer on a surface of said recording layer consisting of a layer of a pure metal oxide, or nitride, or chloride having rocksalt crystal structure and containing at least one metal element selected from Mg, Ca, Zn, Cd, and a second buffer layer on a surface of the first buffer layer consisting of a layer of a oxide, or nitride, or chloride having rocksalt crystal structure and containing at least one major element selected from Mg, Ca, Zn, Cd, and at least one doping element.

11. The element of claim 10, wherein said first buffer layer is preferred to be naturally stable rocksalt metal oxide selected from MgO, MgN, CaO, CaN, MgZnO, CdO, CdN, MgCdO, CdZnO.

12. The element of claim 10, wherein said doping element in said second buffer layer is preferred to be selected from Cr, Al, B, Si, P, S, Cu, Zn, Cd, In, Sn, Ag, Be, Ca, Li, Na, Sc, Ti, Rb, V, Mn.

13. The element of claim 10, wherein said doping element in said second buffer layer is preferred to have a composition equal to or less than 5%.

14. The element of claim 10, wherein an additional oxidization by using of a mixed gas containing natural, or radical, or ionized oxygen and Argon (Ar) is adopted immediately after said first buffer layer is deposited.

15. The element of claim 10, wherein said first buffer layer is preferred to be thinner than said second buffer layer.

16. The element of claim 10, wherein said second buffer layer is preferred to be MgXO or MgZnXO having a doping element X, and X is preferred to be selected from Cr, Al, B, Si, P, S, Cu, Cd, In, Sn, Ag, Be, Ca, Li, Na, Sc, Ti, Rb, V, Mn, Ta, Hf, W, Nb, N, but not limited to these elements.

17. The element of claim 1, further comprises a magnetic compensating layer between said base layer and said buffer layer and having magnetic anisotropy in a direction perpendicular to a film surface and having a second invariable magnetization direction, anti-parallel to said first invariable magnetization direction of said reference layer.

18. The element of claim 17, the magnetic anisotropy value of said compensating layer is at least 1.2 times as large as or at least 1.2 times as small as the magnetic anisotropy of said reference layer, and a varying magnetic field is applied to set said second invariable magnetization direction of said compensating layer anti-parallel to said first invariable magnetization direction of said reference layer.

19. The element of claim 17, said compensating layer has a matched or near-matched net magnetic moment as said reference layer.

20. The element of claim 17, said compensating layer is a multilayer having a sub-layer comprising CoB or CoFeB, FeB immediately adjacent to said buffer layer.

21. A magnetic random memory comprises a memory cell which comprises magnetoresistive element according to the claim 1, which further comprises an upper electrode and a lower electrode which sandwich the memory cell, which further comprises a write circuit which bi-directionally supplies a current to the magnetoresistive element, wherein the memory cell comprises a select transistor electrically connected between the magnetoresistive element and the write circuit.

\* \* \* \* \*